United States Patent
Nguyen

(10) Patent No.: US 8,112,698 B2
(45) Date of Patent: *Feb. 7, 2012

(54) HIGH SPEED TURBO CODES DECODER FOR 3G USING PIPELINED SISO LOG-MAP DECODERS ARCHITECTURE

(75) Inventor: Quang Nguyen, Glen Mills, PA (US)

(73) Assignee: ICOMM Technologies Inc., Wilmington, DE (US)

( * ) Notice: Subject to any disclaimer, the term of this patent is extended or adjusted under 35 U.S.C. 154(b) by 875 days.

This patent is subject to a terminal disclaimer.

(21) Appl. No.: 12/173,799

(22) Filed: Jul. 15, 2008

(65) Prior Publication Data

US 2009/0094505 A1    Apr. 9, 2009

Related U.S. Application Data

(63) Continuation-in-part of application No. 90/008,190, filed on Aug. 25, 2006.

(51) Int. Cl.
*H03M 13/03* (2006.01)

(52) U.S. Cl. .................................. 714/792; 714/796

(58) Field of Classification Search .................. 714/792, 714/796
See application file for complete search history.

(56) References Cited

U.S. PATENT DOCUMENTS

| | | | | |
|---|---|---|---|---|
| 6,094,427 A * | 7/2000 | Yi | | 370/331 |
| 6,594,318 B1 * | 7/2003 | Sindhushayana | | 375/262 |
| 6,745,352 B2 * | 6/2004 | Cheng | | 714/704 |

OTHER PUBLICATIONS

Title = "Turbo Codes MAP Decoder for Wireless Communication Networks" Author = ICOMM Technologies Inc Date =Feb. 13, 1999 p. = 4 website = http://www.fpga-design.com.
Title = "Turbo CodesCodec for Wireless Communication Networks" Author = ICOMM Technologies Inc Date = Feb. 17, 1999 p. = 6 website = http://www.fpga-design.com.

* cited by examiner

*Primary Examiner* — M. Mujtaba K Chaudry
(74) *Attorney, Agent, or Firm* — Bui Garcia-Zamor; Hung H. Bui, Esq.

(57) ABSTRACT

A baseband processor is provided having Turbo Codes Decoders with Diversity processing for computing baseband signals from multiple separate antennas. The invention decodes multipath signals that have arrived at the terminal via different routes after being reflected from buildings, trees or hills. The Turbo Codes Decoder with Diversity processing increases the signal to noise ratio (SNR) more than 6 dB which enables the $3^{rd}$ Generation Wireless system to deliver data rates from up to 2 Mbit/s. The invention provides several improved Turbo Codes Decoder methods and devices that provide a more suitable, practical and simpler method for implementation a Turbo Codes Decoder in ASIC (Application Specific Integrated Circuits) or DSP codes. A plurality of parallel Turbo Codes Decoder blocks is provided to compute baseband signals from multiple different receiver paths. Several pipelined max-Log-MAP decoders are used for iterative decoding of received data. A Sliding Window of Block N data is used for pipeline operations. In a pipeline mode, a first decoder A decodes block N data from a first source, while a second decoder B decodes block N data from a second source during the same clock cycle. Pipelined max-Log-MAP decoders provide high speed data throughput and one output per clock cycle.

26 Claims, 20 Drawing Sheets

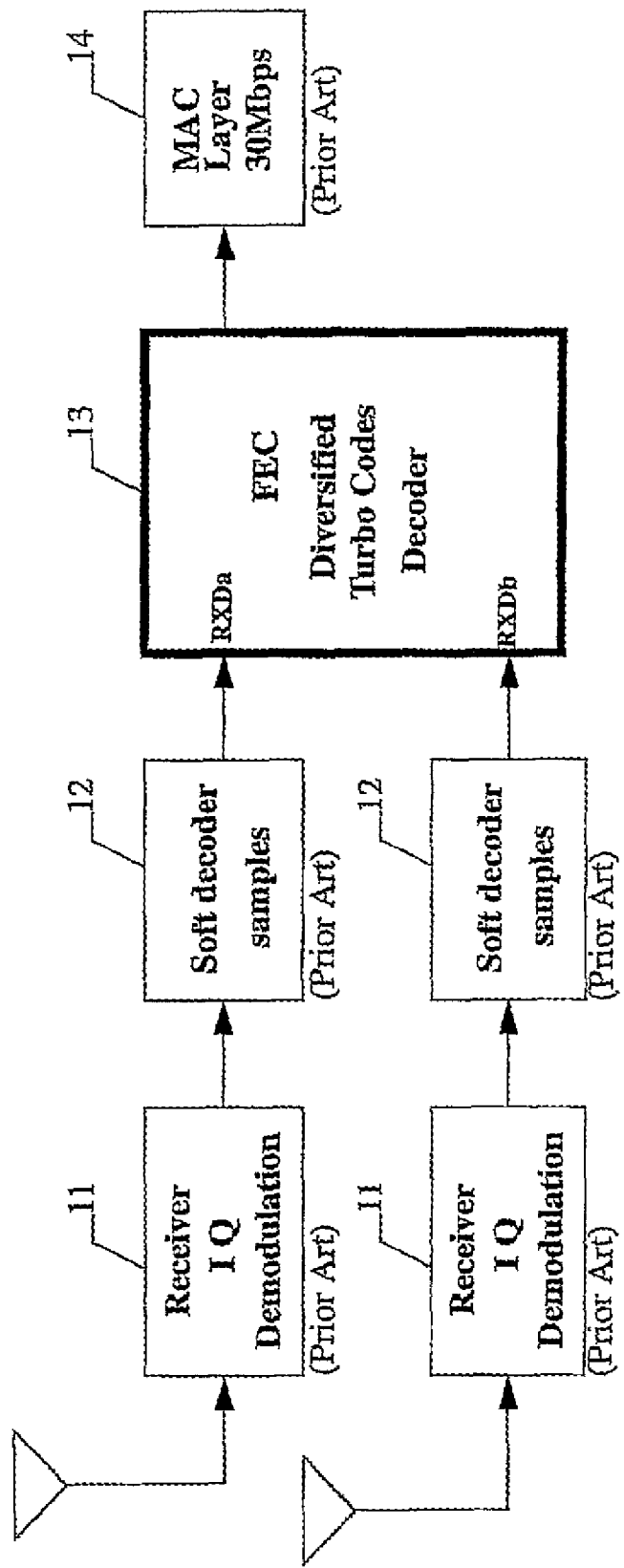
FIGURE 1. Typical diversified 3G Receiver Functional Block Diagram

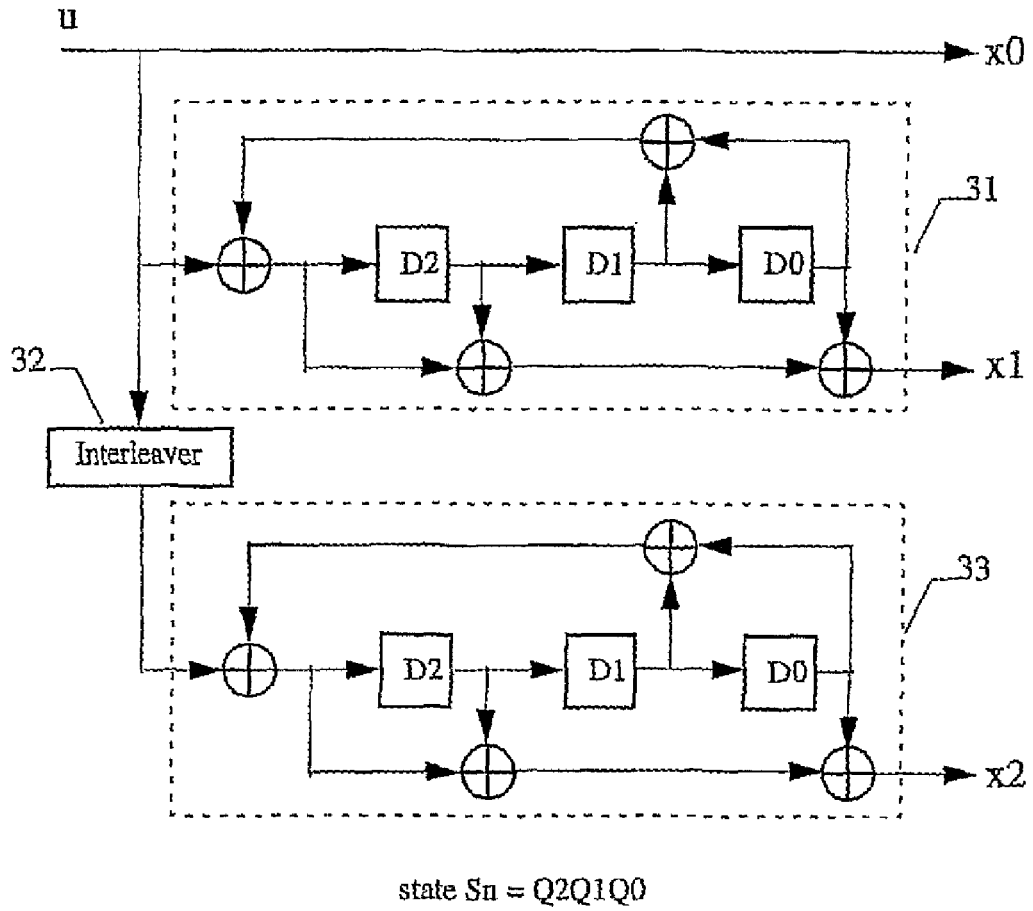
FIGURE 2. The Parallel Concatenated Convolutional Code (PCCC) with 8-states constituent encoder,
(Prior art)

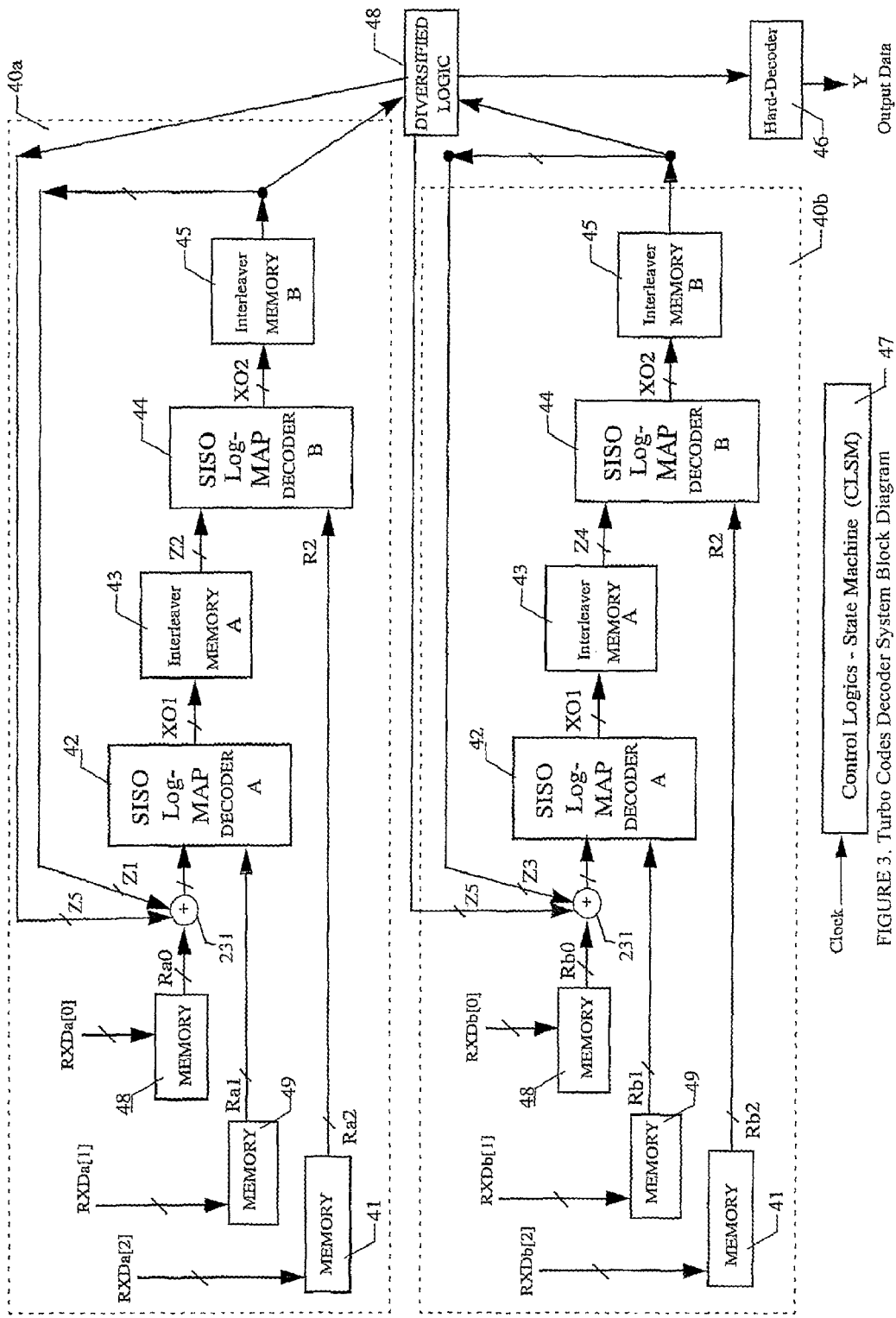
FIGURE 3. Turbo Codes Decoder System Block Diagram
(PRIOR ART)

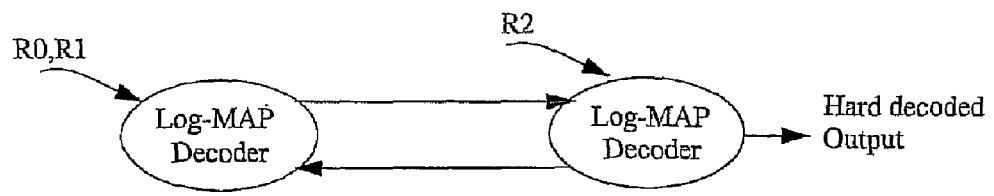
FIGURE 4. Turbo Codes Decoder State Diagram
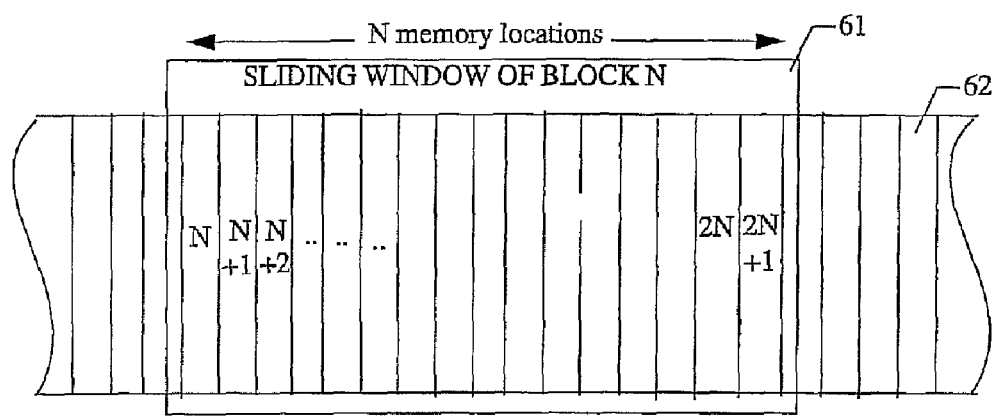
FIGURE 5. Block N Sliding Window Diagram

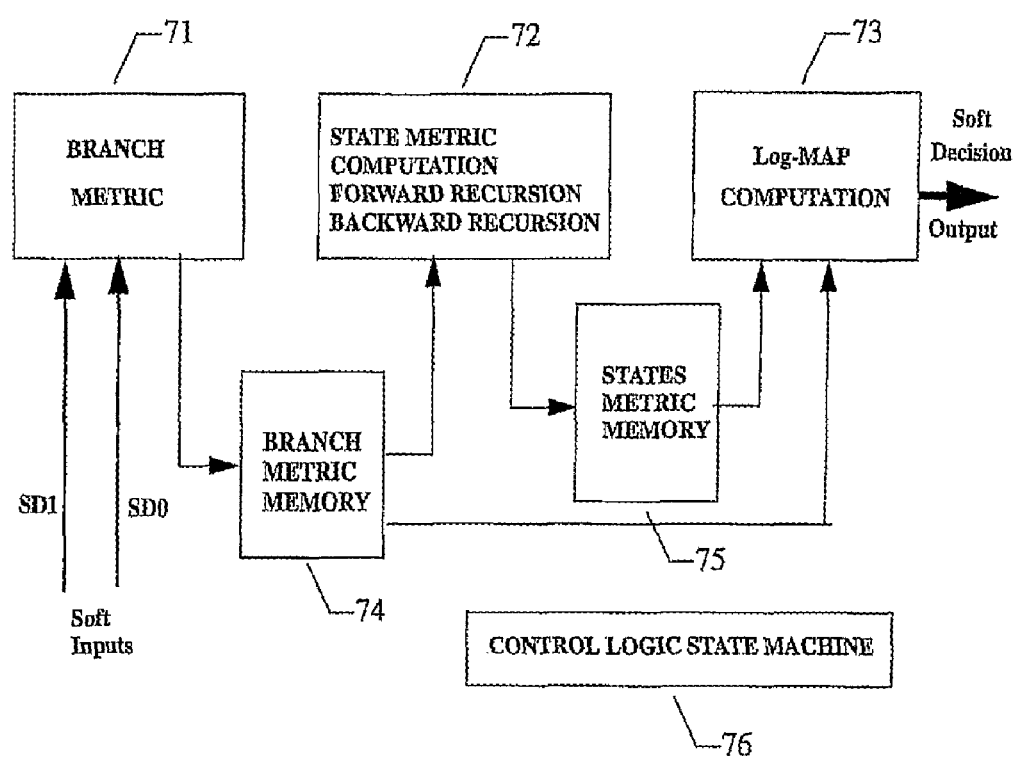
FIGURE 6. The SISO Log-MAP Decoder

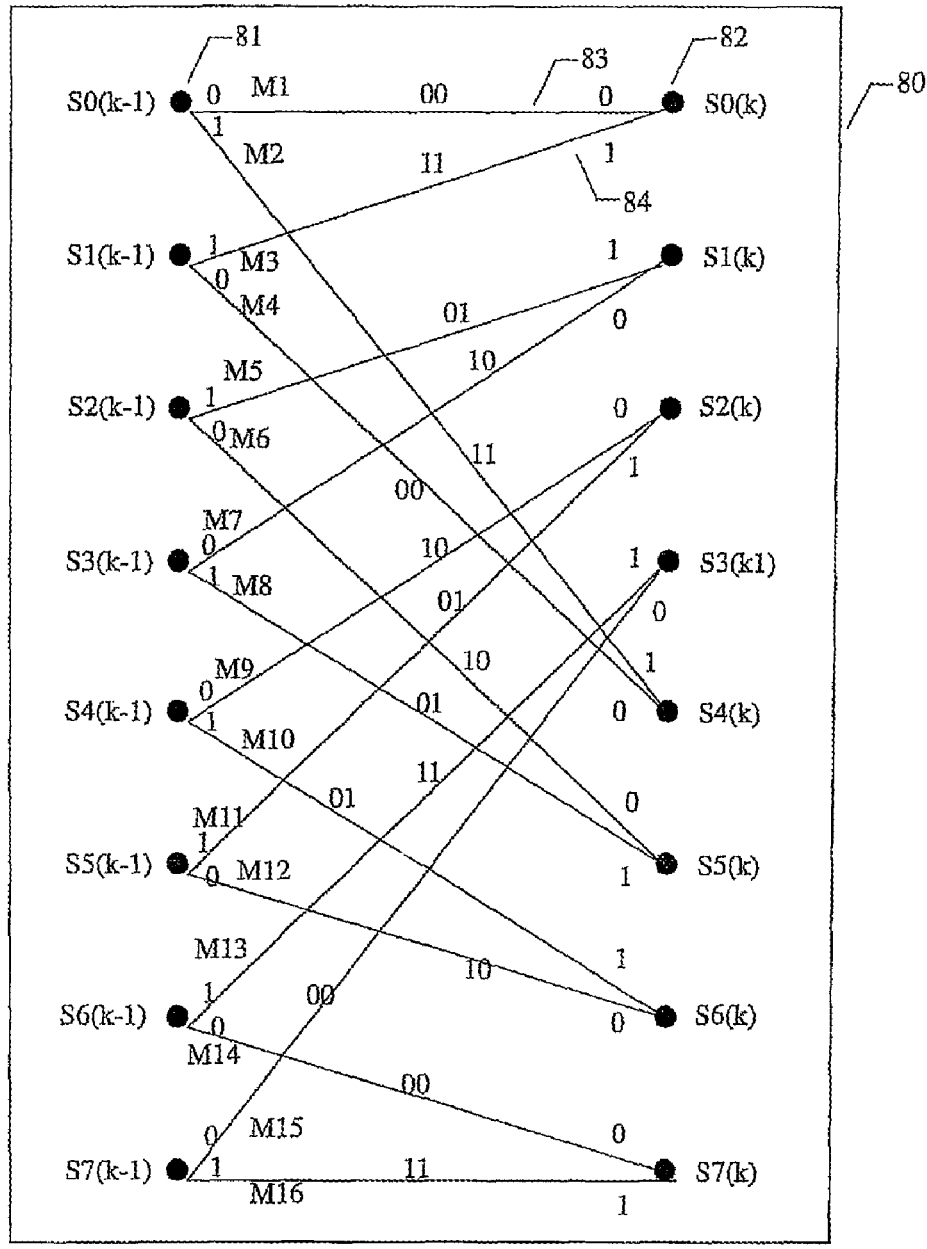
FIGURE 7. The 8-STATES TRELLIS DIAGRAM of a SISO Log-MAP Decoder

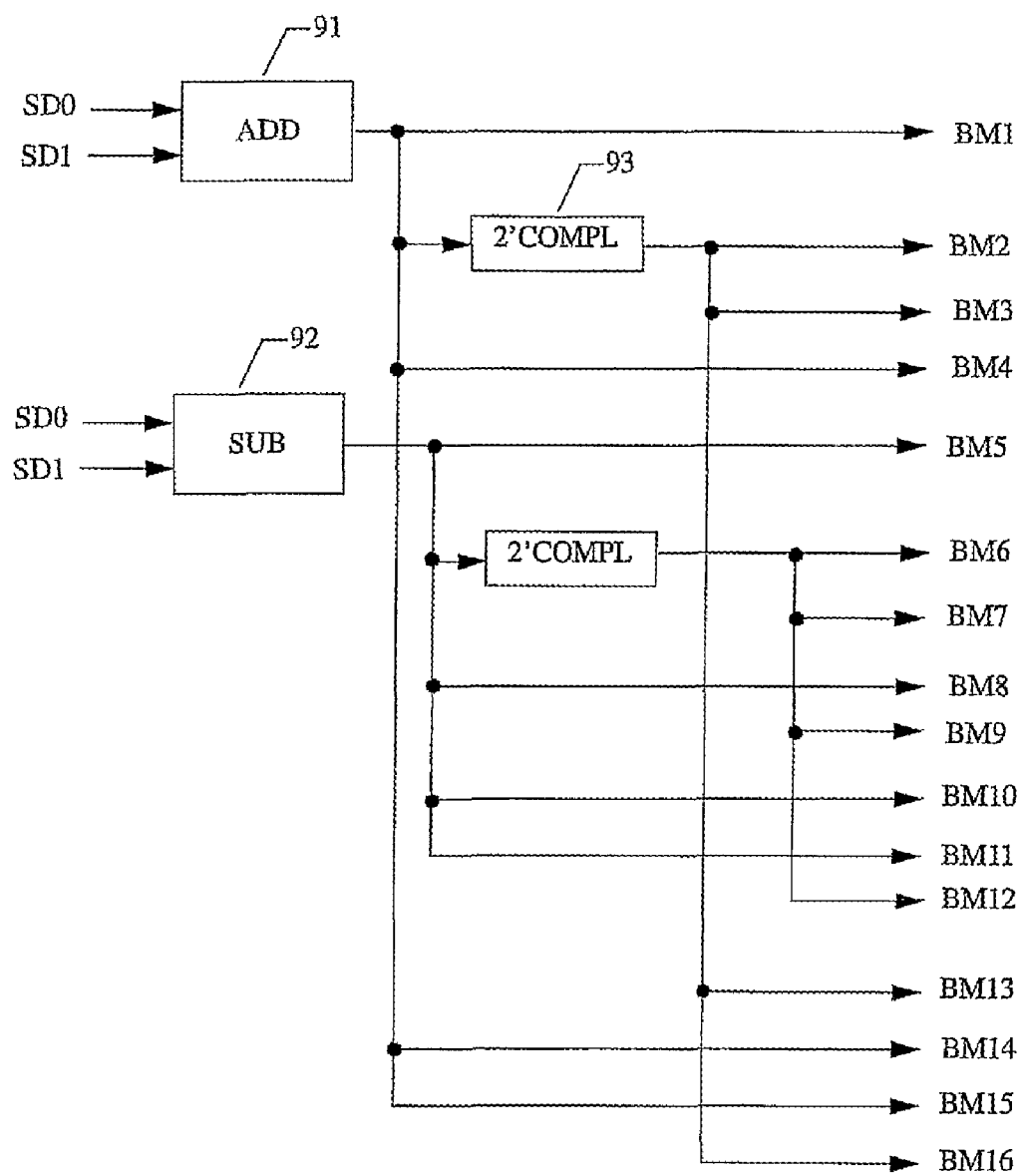
FIGURE 8. BRANCH METRIC COMPUTING MODULE

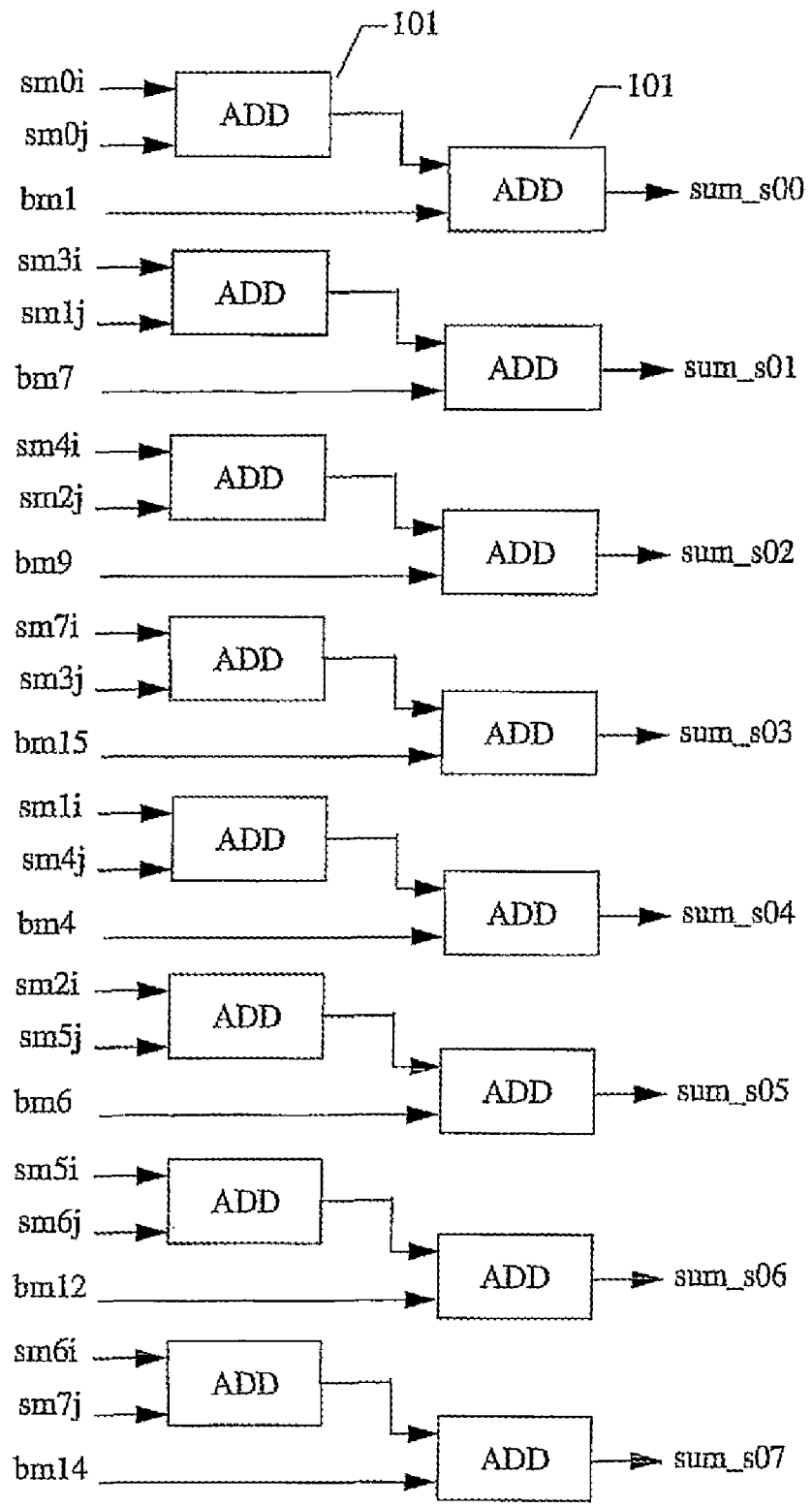
FIGURE 9. LOG-MAP COMPUTING MODULE

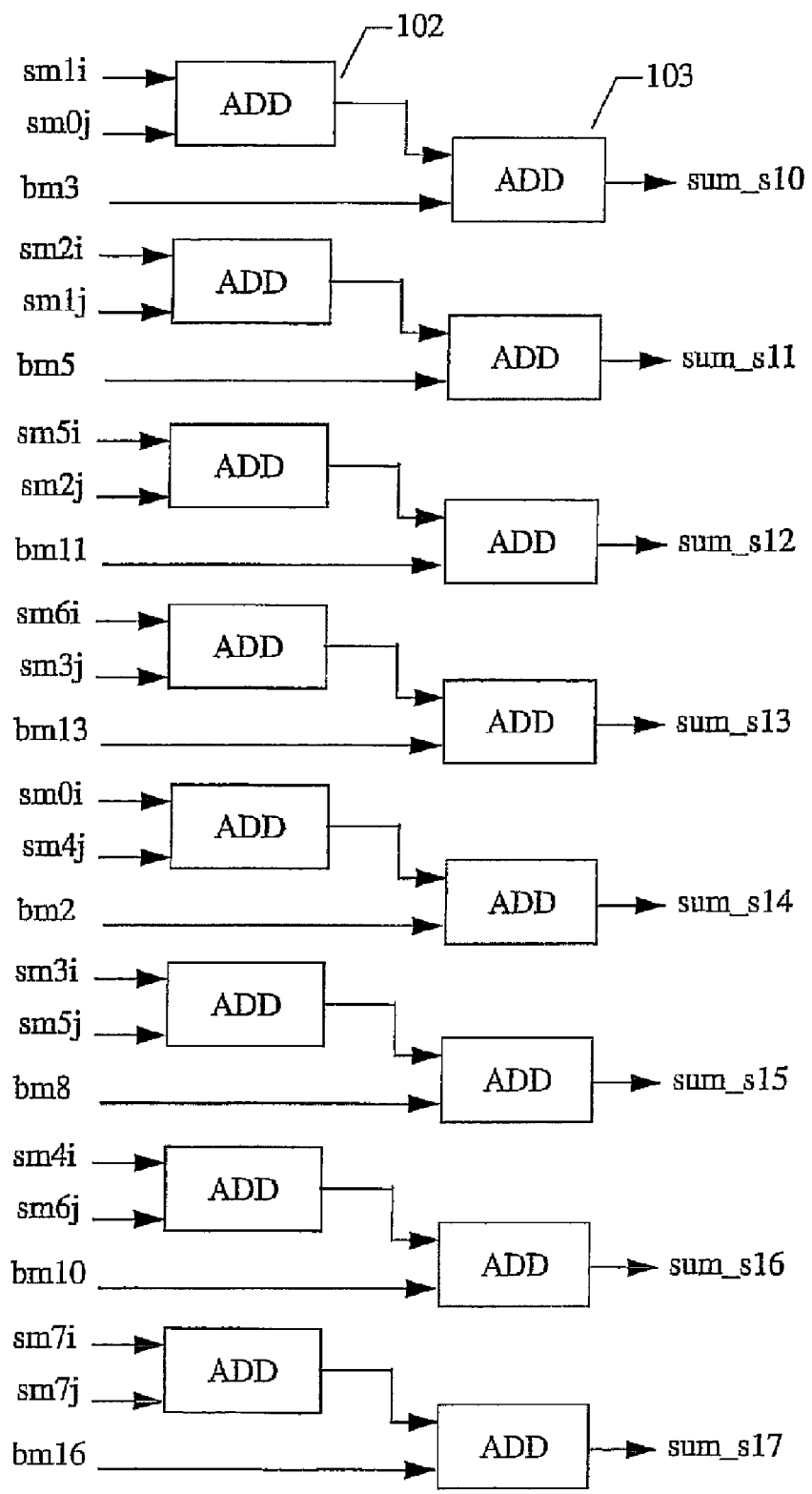
FIGURE 10. LOG-MAP COMPUTING MODULE

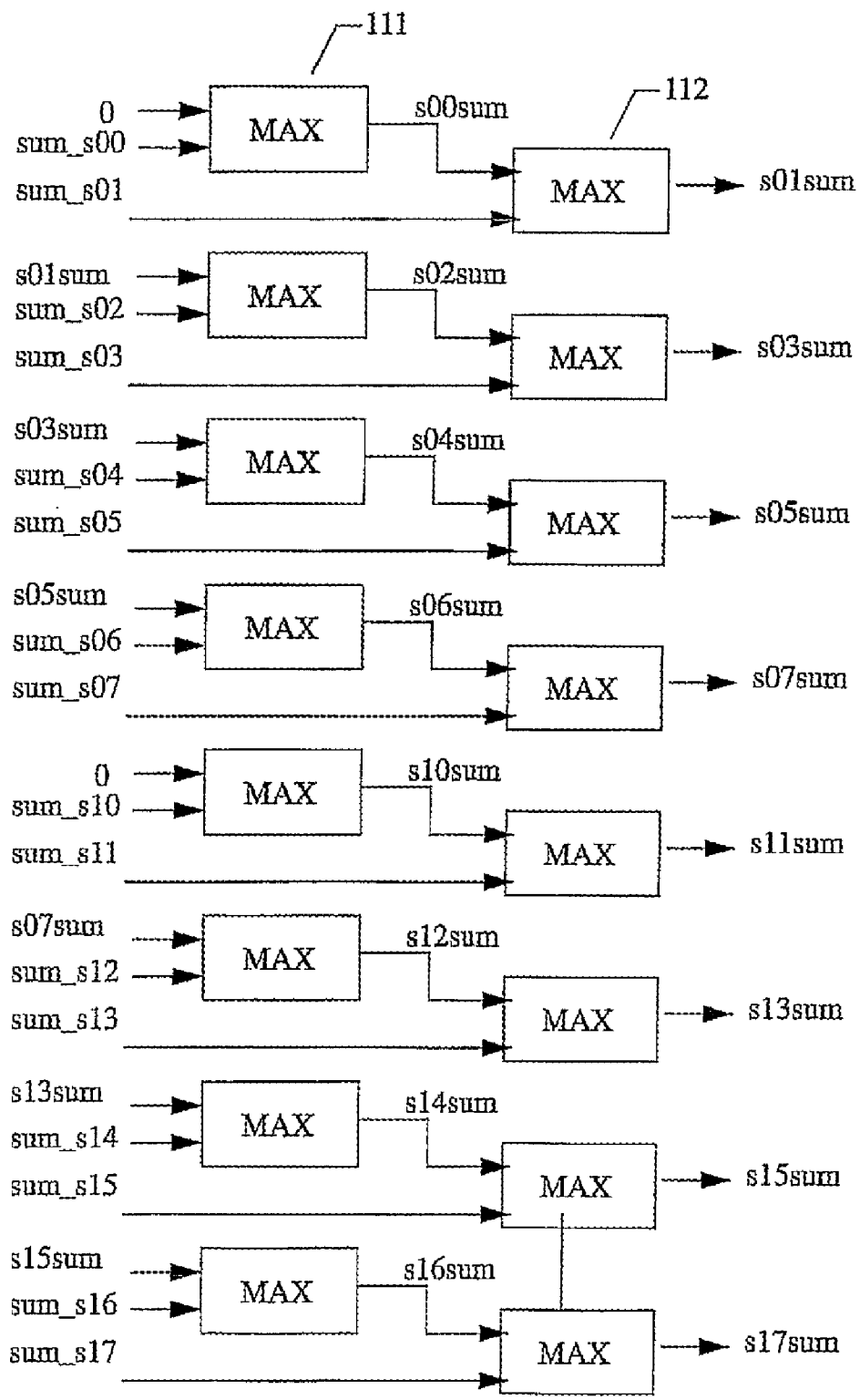
FIGURE 11. Computing Log-MAP for each state

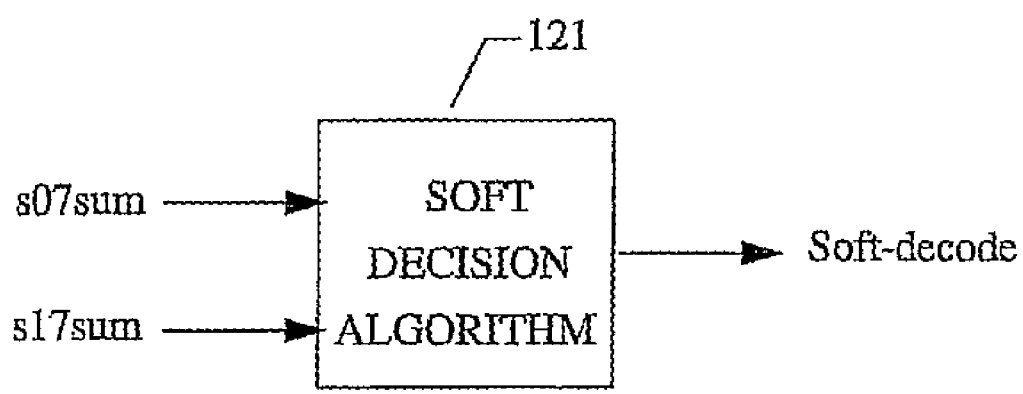
FIGURE 12. Soft Decode output

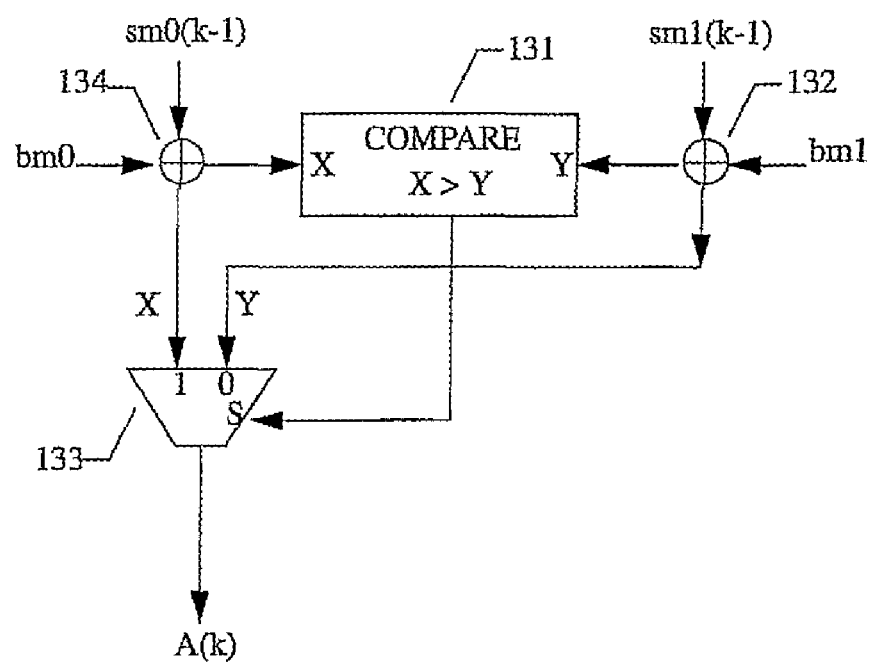
FIGURE 13. Computation of Forward Recursion of state-metric (ACS)

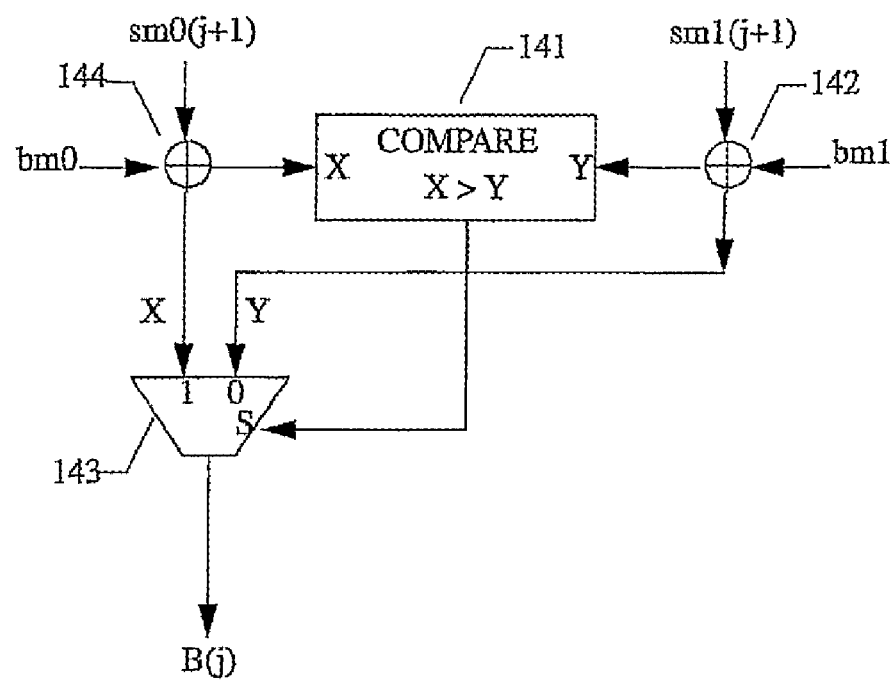
FIGURE 14. Computation of Backward Recursion of state-metric (ACS)

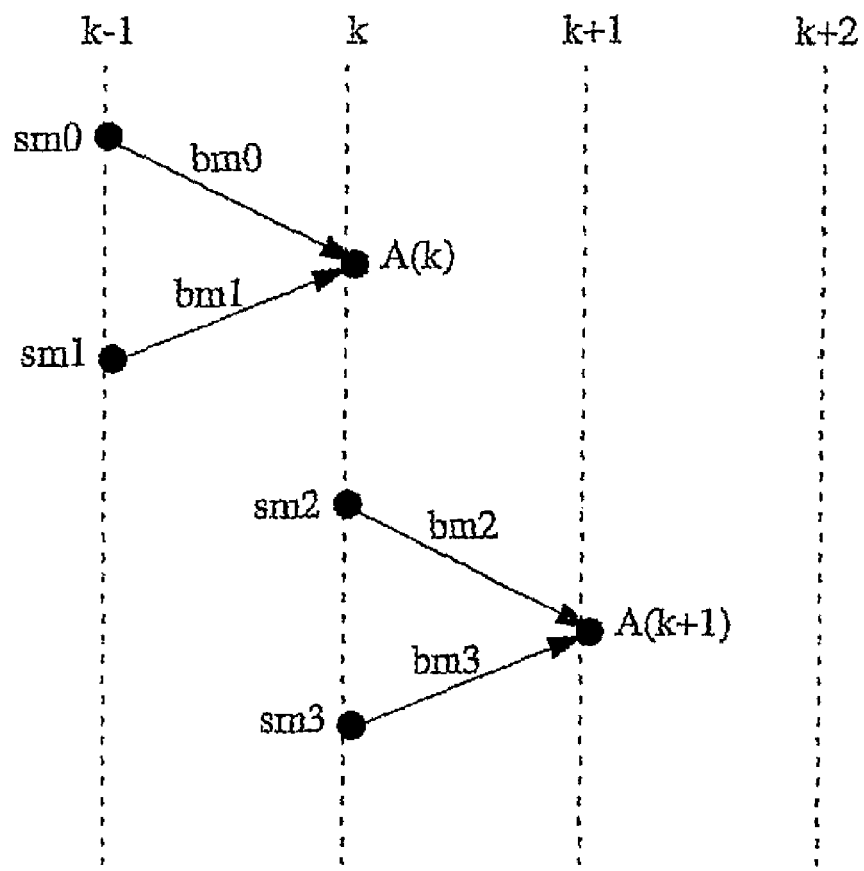
FIGURE 15. Forward computing of Trellis state transitions

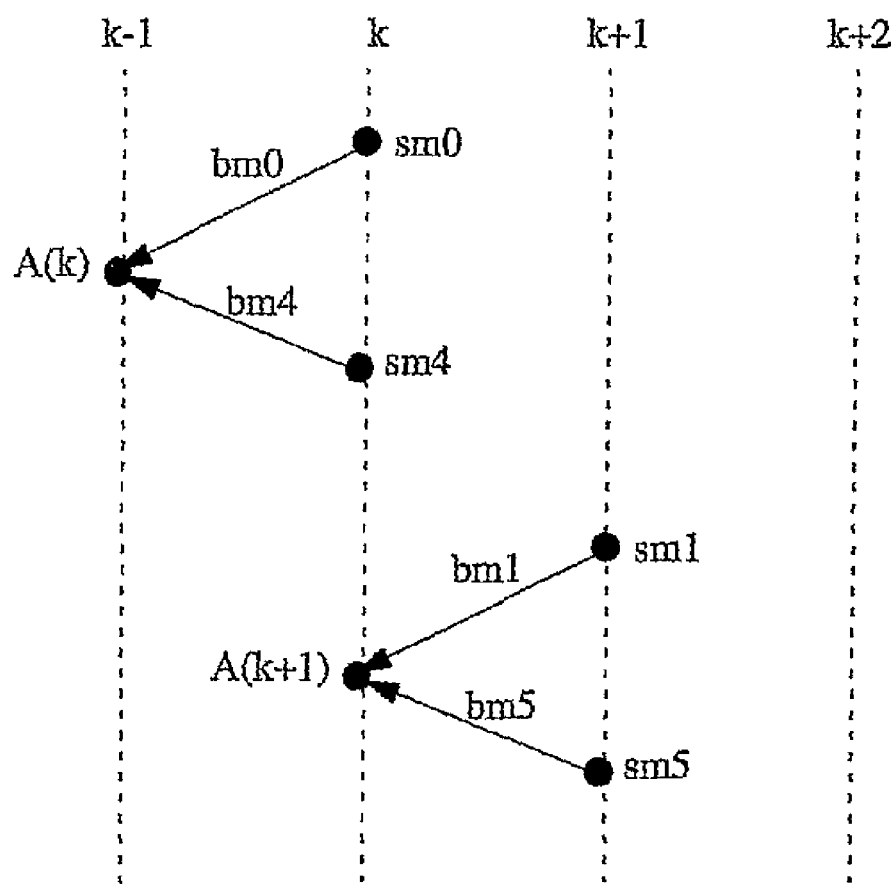
FIGURE 16. Backward computing of Trellis state transitions

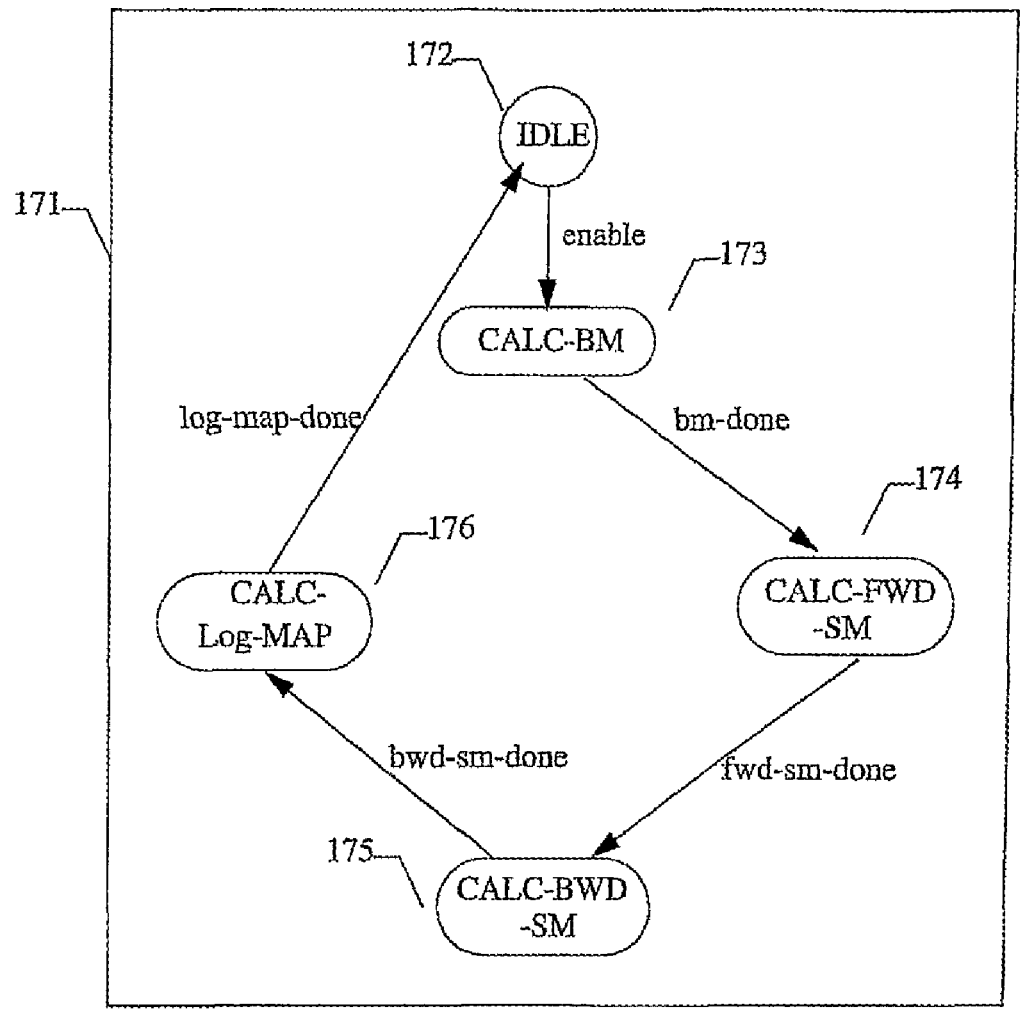
FIGURE 17. State machine operations of Log-MAP Decoder

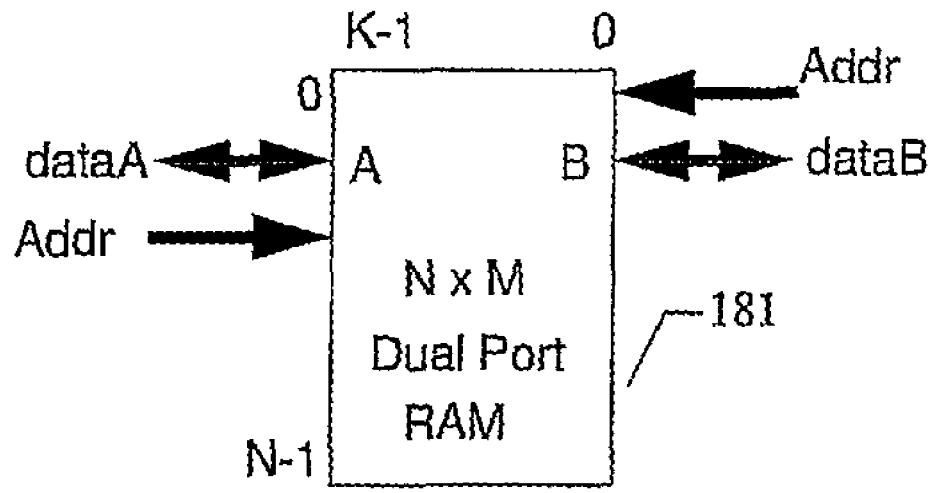
FIGURE 18. BM dual-port Memory Module
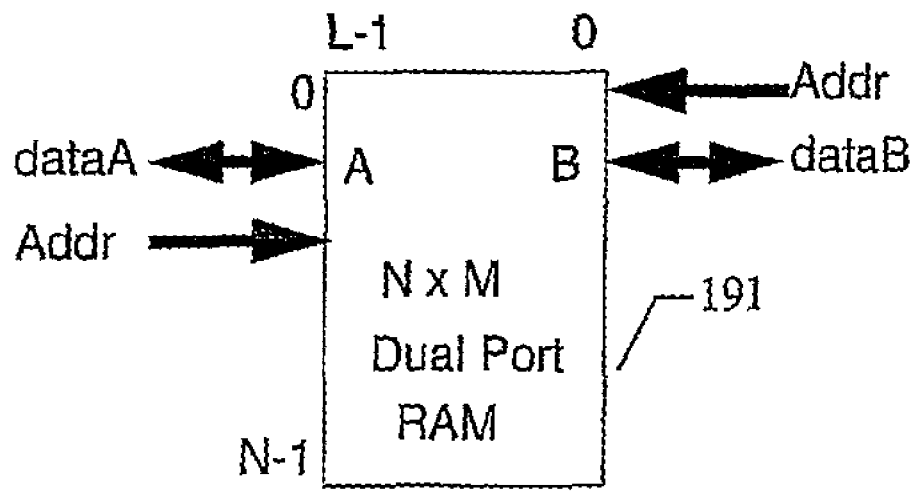
FIGURE 19. SM dual-port Memory Module

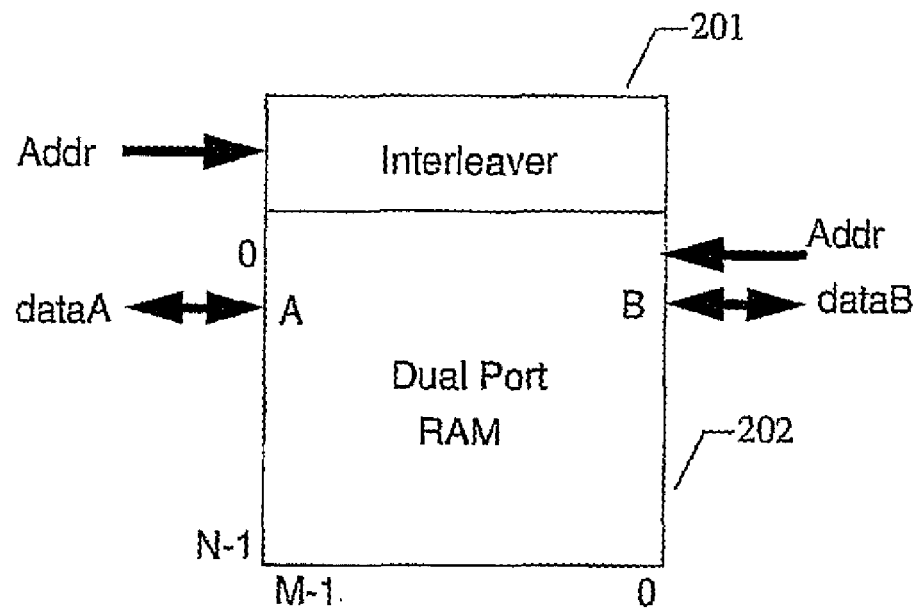
FIGURE 20. Interleaver MEMORY Input Buffer Module for R2
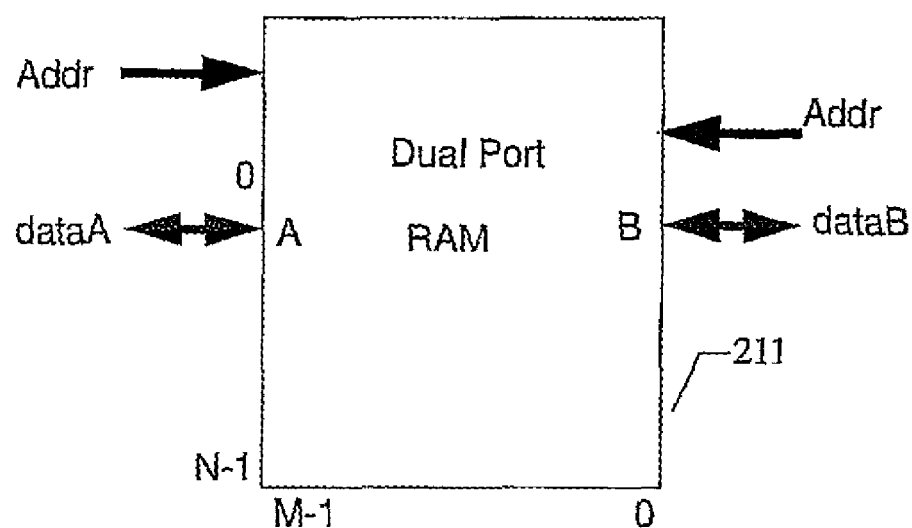
FIGURE 21. MEMORY Input Buffer Module for R0, R1

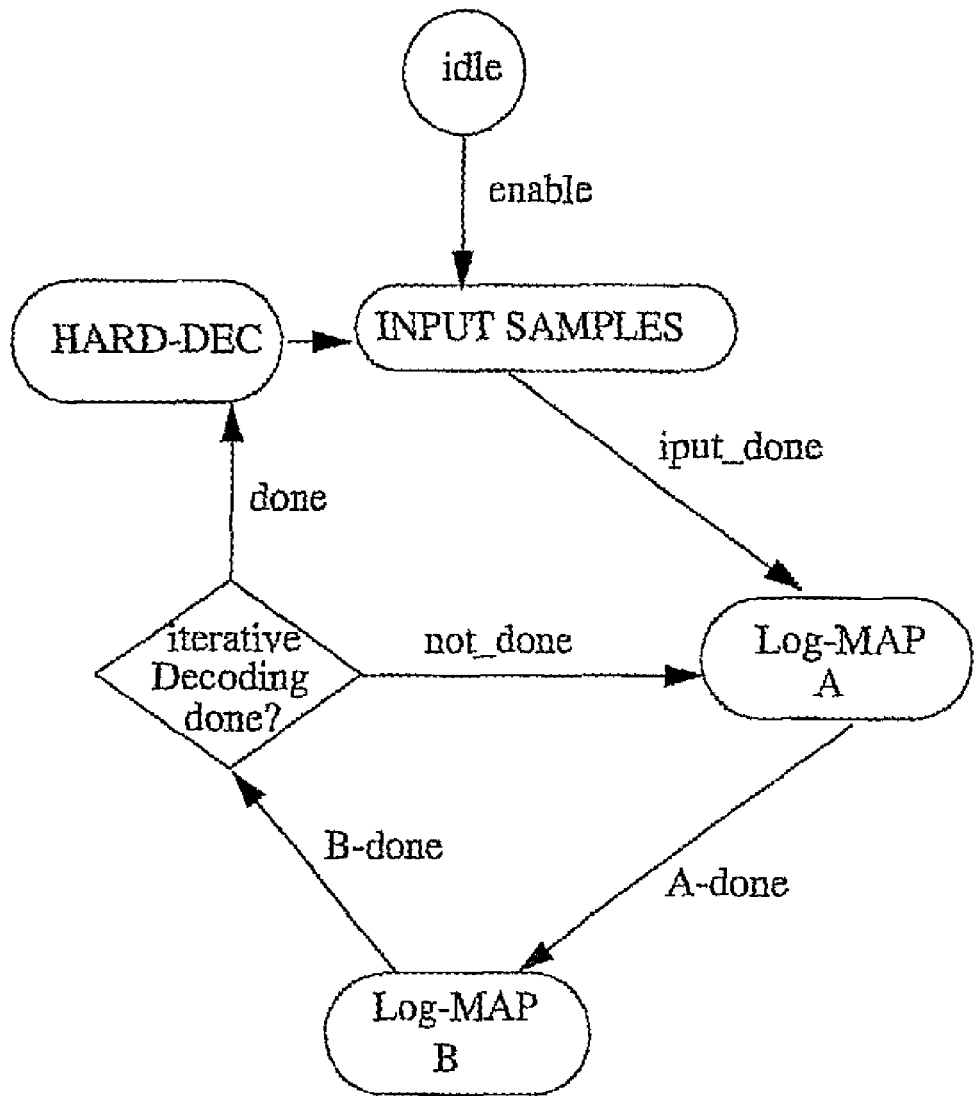
FIGURE 22. State machine operations of Turbo Decoder

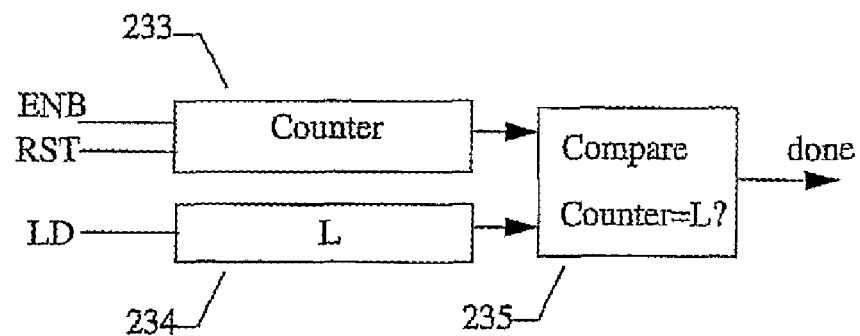
FIGURE 23. Iterative decoding L times
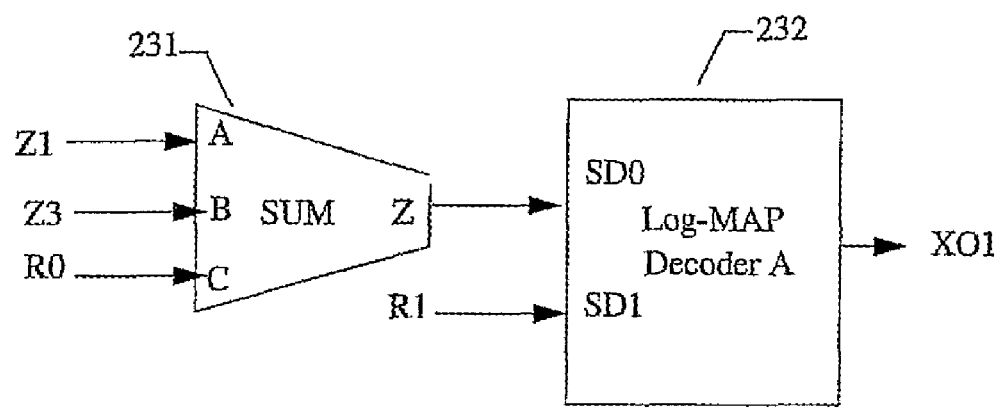
FIGURE 24. Intrinsic values feed-back sum, and diversity processing

HIGH SPEED TURBO CODES DECODER FOR 3G USING PIPELINED SISO LOG-MAP DECODERS ARCHITECTURE

CROSS REFERENCE TO RELATED APPLICATIONS

This application is a continuation-in-part of patent application Ser. No. 90/008,190 filed Aug. 25, 2006.

BACKGROUND OF INVENTION

1. Field of the Invention

This invention relates to Wireless Baseband Processors (Baseband Decoder) and Forward Error-Correction (FEC) Codes for $3^{rd}$ Generation (3G) Wireless Mobile Communications. More particularly, the invention relates to a very high speed Turbo Codes Decoder implementing diversity processing and pipelined Max Log-MAP decoders for 3G Code Division Multiple Access (CDMA2000) and 3G Wideband Code Division Multiple Access (WCDMA).

2. Description of Prior Art

Diversity processing computes signals from two or more separate antennas using so-called "multipath" signals that arrive at the terminal via different routes after being reflected from buildings, trees or hills. Diversity processing can increase the signal to noise ratio (SNR) more than 6 dB, which enables 3G systems to deliver data rates up to 2 Mbit/s.

Turbo Codes decoding is based upon the classic forward error correction concepts that include the use of concatenated Decoders and Interleavers to reduce $E_b/N_0$ for power-limited wireless applications such as digital 3G Wireless Mobile Communications.

A Turbo Codes Decoder is an important part of baseband processor of the digital wireless communication Receiver, which was used to reconstruct the corrupted and noisy received data and to improve BER ($10^{-6}$) throughput. FIG. 1 shows an example of a diversity processing 3G Receiver with a Turbo Codes Decoder 13 which decodes data RXDa and RXDb from Demodulators 11 and Soft Decoders 12, and sends decoded data to the Media Access Control (MAC) layer 14. The data from the two or more received data paths pass through two or more diversity antennas, two or more Demodulators 11, and two or more Soft Decoders 12 to produce soft decoded data RXDa and RXDb for the Turbo Codes Decoder 13.

A widely used Forward Error Correction (FEC) scheme is the Viterbi Algorithm Decoder in both wired and wireless applications. A drawback of the Viterbi Algorithm Decoder is that it requires a long wait for decisions until the whole sequence has been received. A delay of six times the memory processing speed of the received data is required for decoding. One of the more effective FEC schemes, with higher complexity, uses a maximum a posteriori (MAP) algorithm to decode received messages. The MAP algorithm is computationally complex, requiring many multiplications and additions per bit to compute the posteriori probability. A major difficulty with the use of the MAP algorithm has been the implementation in semiconductor ASIC devices. The complexity of the multiplications and additions slow down the decoding process and reduce the throughput data rates. Furthermore, even under the best conditions, multiplication operations in the MAP algorithm require implementation using large circuits in the ASIC. The result is costly design and low performance in bit rates throughput.

Recently, the $3^{rd}$ Generation Partnership Project (3GPP) organization introduced a new class of error correction codes using parallel concatenated codes (PCCC) that include the use of the classic recursive systematic constituent (RSC) Encoders and Interleavers as shown in FIG. 2. An example of the 3GPP Turbo Codes PCCC with 8-states and rate ⅓ is shown in FIG. 2. Data enters the two systematic encoders 31 and 33 separated by an interleaver 32. An output codeword consists of the source data bit followed by the output bits of the two encoders.

Other prior work relating to error correction codes was performed by Berrou et al., describing parallel concatenated codes which are complex encoding structures that are not suitable for portable wireless device. Another U.S. Pat. No. 6,023,783 to Divsalar et al. describes an improved encoding method over Berrou et al., using mathematical concepts of parallel concatenated codes. However, patents by Berrou et al., Divsalar et al., and others only describe the concept of parallel concatenated codes using mathematical equations which are good for research in deep space communications and other government projects, but are not feasible, economical, and suitable for consumer portable wireless devices. In these prior systems, the encoding of data is simple and can be easily implemented with a few xor and flip-flop logic gates. But decoding the Turbo Codes is much more difficult to implement in ASIC or software. The prior art describes briefly the implementation of the Turbo Codes Decoder which are mostly for deep space communications and requires much more hardware, power consumption and costs.

All the prior art Turbo Codes fail to provide simple and suitable methods and architectures for a Turbo Codes Decoder as it is required and desired for 3G cellular phones and 3G personal communication devices, including the features of high speed data throughput, low power consumption, lower costs, limited bandwidth, and limited power transmitter in noisy environments.

SUMMARY OF INVENTION

The present invention is directed to Baseband Processor using diversity processing to implement a more efficient, practical and suitable architecture and method to achieve the requirements for 3G wireless systems, including the features of higher speed data throughput, lower power consumptions, lower costs, and suitable for implementation in ASIC or DSP codes. The present invention encompasses several improved and simplified Turbo Codes Decoder methods and devices to deliver higher speed and lower power consumption, especially for 3G applications. Diversity processing can increase the signal to noise ratio (SNR) more than 6 dB, which enables 3G systems to deliver data rates up to 2 Mbit/s. As shown in FIG. 3, an exemplary embodiment of the Turbo Codes Decoder utilizes two parallel Turbo Codes Decoders for diversity processing. Each Turbo Codes Decoder has serially concatenated Soft-input Soft-output logarithm maximum a posteriori (SISO Log-MAP) Decoders. The two decoders function in a pipelined scheme with delay latency N. While the first decoder is decoding data stored in the second-decoder-Memory, the second decoder performs decoding for data stored in the first-decoder-Memory, which produces a decoded output every clock cycle. As shown in FIG. 5, the Turbo Codes Decoder utilizes a Sliding Window of Block N on the input buffer memory to decode data per block N, which improves processing efficiency. Accordingly, several objects and advantages of the Turbo Codes Decoder are:

To implement diversity processing to increase the signal to noise ratio (SNR).

To deliver higher speed throughput and be suitable for implementation in application specific integrated circuit (ASIC) designs or digital signal processor (DSP) codes.

To utilize SISO Log-MAP decoders for best result and faster decoding and simplified implementation in ASIC circuits and DSP codes with the use of binary adders for computation.

To perform re-iterative decoding of data back-and-forth between the two Log-MAP decoders in a pipelined scheme until a decision is made. In such pipelined scheme, decoded output data is produced each clock cycle.

To utilize a Sliding Window of Block N on the input buffer memory to decode data per block N for improved pipeline processing efficiency To provide higher performance in term of symbol error probability and low BER ($10^{-6}$) for 3G applications such as 3G WCDMA, and 3G CDMA2000 operating at very high bit-rate up to 100 Mbps, in a low power, noisy environment.

To utilize a simplified and improved SISO Log-MAP decoder architecture, including a branch-metric (BM) calculations module, a recursive state-metric (SM) forward/backward calculations module, an Add-Compare-Select (ACS) circuit, a Log-MAP posteriori probability calculations module, and an output decision module.

To reduce complexity of multiplier circuits in MAP algorithm by performing the entire MAP algorithm in Log Max approximation using binary adder circuits, which are more suitable for ASIC and DSP codes implementation, while still maintaining a high level of performance output.

To design an improve Log-MAP Decoder using high level design language (HDL) such as Verilog, system-C and VHDL, which can be synthesized into custom ASIC and Field Programmable Gate Array (FPGA) devices.

To implement an improve Log-MAP Decoder in DSP (digital signal processor) using optimized high level language C, C++, or assembly language.

Still further objects and advantages will become apparent to one skill in the art from a consideration of the ensuing descriptions and accompanying drawings.

BRIEF DESCRIPTION OF DRAWINGS

FIG. 1 illustrates a conventional 3G Receiver Functional Block Diagram which uses Turbo Codes Decoder for error-correction.

FIG. 2 illustrates a block diagram of a conventional 8-states 3GPP Parallel Concatenated Convolutional Codes.

FIG. 3 illustrates the Turbo Codes Decoder System Block Diagram showing Log-MAP Decoders, Interleavers, Memory Buffers, and control logics, according to an embodiment of the invention.

FIG. 4 illustrates a Turbo Codes Decoder State Diagram, according to an embodiment of the invention.

FIG. 5 illustrates the Block N Sliding Window Diagram, according to an embodiment of the invention.

FIG. 6 illustrates a block diagram of the SISO Log-MAP Decoder showing Branch Metric module, State Metric module, Log-MAP module, and State and Branch Memory modules, according to an embodiment of the invention.

FIG. 7 illustrates the 8-States Trellis Diagram of a SISO Log-MAP Decoder using the 3GPP 8-state PCCC Turbo codes, according to an embodiment of the invention.

FIG. 8 illustrates a block diagram of the BRANCH METRIC COMPUTING module, according to an embodiment of the invention.

FIG. 9 illustrates a block diagram of the Log-MAP computing for u=0, according to an embodiment of the invention.

FIG. 10 illustrates a block diagram of the Log-MAP computing for u=1, according to an embodiment of the invention.

FIG. 11 illustrates a block diagram of the Log-MAP Compare & Select 1 maximum logic for each state, according to an embodiment of the invention.

FIG. 12 illustrates a block diagram of the Soft Decode module, according to an embodiment of the invention.

FIG. 13 illustrates a block diagram of the Computation of Forward Recursion of State Metric module (FACS), according to an embodiment of the invention.

FIG. 14 illustrates a block diagram of the Computation of Backward Recursion of State Metric module (BACS), according to an embodiment of the invention.

FIG. 15 illustrates State Metric Forward computing of Trellis state transitions, according to an embodiment of the invention.

FIG. 16 illustrates State Metric Backward computing of Trellis state transitions, according to an embodiment of the invention.

FIG. 17 illustrates a block diagram of the State Machine operations of Log-MAP Decoder, according to an embodiment of the invention.

FIG. 18 illustrates a block diagram of the BM dual-port Memory Module, according to an embodiment of the invention.

FIG. 19 illustrates a block diagram of the SM dual-port Memory Module, according to an embodiment of the invention.

FIG. 20 illustrates a block diagram of the Interleaver dual-port RAM Memory Memory Module, according to an embodiment of the invention.

FIG. 21 illustrates a block diagram of the De-Interleaver dual RAM Memory Module, according to an embodiment of the invention.

FIG. 22 illustrates a flow chart of an exemplary state machine operation, according to an embodiment of the invention.

FIG. 23 illustrates a block diagram of the Iterative decoding feedback control, according to an embodiment of the invention.

FIG. 24 illustrates a block diagram of the intrinsic feedback Adder of the Turbo Codes Decoder, according to an embodiment of the invention.

DETAILED DESCRIPTION

Turbo Codes Decoder

An illustration of a 3GPP 8-state Parallel Concatenated Convolutional Code (PCCC), with coding rate ⅓, constraint length K=4 is illustrated in FIG. 2. An implementation using SISO Log-MAP Decoders is illustrated in FIG. 3.

In accordance with an exemplary embodiment, a diversity processing Turbo Codes Decoder includes two parallel blocks 40*a*, 40*b* of Turbo Codes Decoders for each path of received data RXDa and RXDb. Each identical Turbo Codes Decoder block 40*a*, 40*b* has concatenated max Log-MAP SISO Decoders A 42 and B 44 connected in a feedback loop with Interleaver Memory 43 and Interleaver Memory 45. The Soft output of Turbo Codes Decoder block 40*a* is fed into the input of the Diversified Logic block 48. Conversely, the Soft output of Turbo Codes Decoder block 40*b* is fed-back into the input of the Diversified Logic block 48. The sum of the two outputs Z1, Z3 of the Turbo Codes Decoder block 40*a*, 40*b* is fed into the Hard-Decoder to generate output Y data. The Diversified Logic block 48 computes the intrinsic feedback values Z5 for the input into the Turbo Codes Decoder blocks 40*a* and 40*b* through Adder 231.

Signals Ra2, Ra1, Ra0 are received soft decision signals of data path A from the system receiver. Signals XO1 and XO2 are output soft decision signals of the Log-MAP Decoders A 42 and B 44, respectively, which are stored in the Interleaver Memory 43 and Memory 45 module. Signals Z2 and Z1 are the output of the Interleaver Memory 43 and Interleaver Memory 45. Z2 is fed into Log-MAP decoder B 44 and Z1 is looped back into Log-MAP decoder A 42 through Adder 231.

Signals Rb2, Rb1, Rb0 are received soft decision signals of data path B from the system receiver. Signals XO1 and XO2 are output soft decision of the Log-MAP Decoders A 42 and B 44, respectively, which are stored in the Interleaver Memory 43 and Memory 45 module. Signals Z4 and Z3 are the output of the Interleaver Memory 43 and Interleaver Memory 45. Z4 is fed into Log-MAP decoder B 44 and Z3 is looped back into Log-MAP decoder A 42 through Adder 231.

In accordance with the invention, signal Z5 is fed back into Log-MAP decoder A 42 of block 40*a* through Adder 231, and Signal Z5 is fed back into Log-MAP decoder A 42 of block 40*b* through Adder 231 for diversity processing.

Each Interleaver Memory 43, 45, shown in FIG. 20, includes one interleaver 201 and a dual-port RAM memory 202. Input Memory blocks 41, 48, 49, shown in FIG. 21, include dual-port RAM memory 211. Control logic module (CLSM) 47 consists of various state-machines, which control all the operations of the Turbo Codes Decoder. The hard-decoder module 46 outputs the final decoded data.

More particularly, as illustrated in FIG. 3, Ra0, Rb0 are data bits corresponding to the transmit data bit u, Ra1, Rb1 are the first parity bits corresponding to the output bit of the first RSC encoder, and Ra2, Rb2 are interleaved second parity bits corresponding to the output bit of the second RSC encoder.

In accordance with the invention, corresponding ones of data bits Ra0, Rb0 are added to the feedback signals Z5, Z1 and Z3, then fed into the decoder A. Corresponding ones of data bits Ra1, Rb1 are also fed into decoder A for decoding the first stage of decoding output X01. Z2 and corresponding ones of Ra2, Rb2 are fed into decoder B for decoding the second stage of decoding output X02.

In accordance with the invention, as shown in FIG. 5, the Turbo Codes Decoder utilizes a Sliding Window of Block N 61 on the input buffers 62 to decode one block N data at a time, the next block N of data is decoded after the previous block N is done in a circular wrap-around scheme for pipeline operations. In another embodiment, the Sliding Window of Block N is used on the input buffer Memory so that each block N data is decoded at a time one block after another in a pipeline scheme.

In accordance with the invention, the Turbo Codes Decoder decodes an 8-state Parallel Concatenated Convolutional Code (PCCC). The Turbo Codes Decoder also decodes a higher n-state Parallel Concatenated Convolutional Code (PCCC)

As illustrated in FIG. 3, the Turbo Codes Decoder functions effectively as follows:

Received soft decision data (RXDa[2:0]) is stored in three input buffers Memory blocks 48, 49, 41 to produce data bits Ra0, Ra1, and Ra2 that correspond to data words. Each output data word Ra0, Ra1, Ra2 contains a number of binary bits.

Received soft decision data (RXDb[2:0]) is stored in three input buffers Memory blocks 48, 49, 41 to produce Rb0, Rb1, and Rb2 that correspond to data words. Each output data word Rb0, Rb1, Rb2 contains a number of binary bits.

A Sliding Window of Block N is imposed onto each input memory to produce corresponding ones of Ra0, Rb0, Ra1, Rb1, Ra2, and Rb2 output data words.

In accordance with the method of the invention, when an input data block of size N is ready, the Turbo Decoder starts the Log-MAP Decoder A, in block 40*a*, to decode the N input data based on the soft-values of Ra0, Z1, Z5 and Ra1, then stores the outputs in the Interleaver Memory A.

The Turbo Decoder also starts the Log-MAP Decoder B, in block 40*a*, to decode the N input data based on the soft-values of Ra2 and Z2, in pipelined mode with a delay latency of N, then stores the output in the Interleaver Memory.

When an input data block of size N is ready, the Turbo Decoder starts the Log-MAP Decoder A, in block 40*b*, to decode the N input data based on the soft-values of Rb0, Z5, Z3 and Rb1, then stores the outputs in the Interleaver Memory A.

The Turbo Decoder also starts the Log-MAP Decoder B, in block 40*b*, to decode the N input data based on the soft-values of Rb2 and Z4, in pipelined mode with a delay latency of N, and then store the outputs in the Interleaver Memory.

The Turbo Decoder performs iterative decoding for L number of times (L=1, 2, . . . , M). The Log-MAP Decoder A receives the sum of (Z1 and Z3 and corresponding ones of Ra0, Rb0 as inputs. The Log-MAP Decoder A also receives corresponding ones of Ra1, Rb1 as inputs. The Log-MAP Decoder B receives the data Z2 and R2 as inputs.

When the iterative decoding sequence is complete, the Turbo Decoder starts the hard-decision operations to compute and produce soft-decision outputs.

SISO Log-MAP Decoder

As shown in FIG. 6, SISO Log-MAP Decoders 42, 44 include a Branch Metric (BM) computation module 71, a State Metric (SM) computation module 72, a Log-MAP computation module 73, a BM Memory module 74, a SM Memory module 75, and a Control Logic State Machine module 76. Soft-value inputs enter the Branch Metric (BM) computation module 71, where Euclidean distance is calculated for each branch, the output branch metrics are stored in the BM Memory module 74. The State Metric (SM) computation module 72 reads branch metrics from the BM Memory 74 and computes the state metric for each state; the output state-metrics are stored in the SM Memory module 75. The Log-MAP computation module 73 reads both branch-metrics and state-metrics from BM memory 74 and SM memory 75 modules to compute the Log Maximum a Posteriori probability and produce soft-decision output. The Control Logic State-machine module 76 provides the overall operations of the decoding process.

As shown in FIG. 6 which is one example of 3GPP Turbo Codes Decoder, the Log-MAP Decoder 42 44 functions effectively as follows:

The Log-MAP Decoder 42, 44 reads each soft-values (SD) data pair input, then computes branch-metric (BM) values for all paths in the Turbo Codes Trellis 80 as shown in FIG. 7. The computed BM data is stored into BM Memory 74. The process of computing BM values is repeated for each input data until all N samples are calculated and stored in BM Memory 74.

The Log-MAP Decoder 42 44 reads BM values from BM Memory 74 and SM values from SM Memory 75, and computes the forward state-metric (SM) for all states in the Trellis 80 as shown in FIG. 7. The computed forward SM data is stored into SM Memory 75. The process of computing forward SM values is repeated for each input data until all N samples are calculated and stored in SM Memory 75.

The Log-MAP Decoder 42 44 reads BM values from BM Memory 74 and SM values from SM Memory 75, and computes the backward state-metric (SM) for all states in the Trellis 80 as shown in FIG. 7. The computed backward SM data is stored into the SM Memory 75. The process of computing backward SM values is repeated for each input data until all N samples are calculated and stored in SM Memory 75.

The Log-MAP Decoder 42 44 then computes Log-MAP posteriori probability for u=0 and u=1 using the BM values and SM values from BM Memory 74 and SM Memory 75. The process of computing Log-MAP posteriori probability is repeated for each input data until all N samples are calculated. The Log-MAP Decoder then decodes data by making soft decision based on the posteriori probability for each stage and produces soft-decision output, until all N inputs are decoded.

Branch Metric Computation Module

The Branch Metric (BM) computation module 71 computes the Euclidean distance for each branch in the 8-states Trellis 80 as shown in the FIG. 7 based on the following equations:

Local Euclidean distances values=$SD0*G0+SD1*G1$ where SD0 and SD1 are soft-value input data and G0 and G1 are the expected input for each path in the Trellis 80. G0 and G1 are coded assigned antipodal values, meaning that 0 corresponds to +1 and 1 corresponds to −1. Therefore, the local Euclidean distances for each path in the Trellis 80 are computed by the following equations:

$M1=SD0+SD1$ $M2=-M1$ $M3=M2$ $M4=M1$ $M5=-SD0+SD1$ $M6=-M5$ $M7=M6$ $M8=M5$ $M9=M6$ $M10=M5$ $M11=M5$ $M12=M6$ $M13=M2$ $M14=M1$ $M15=M1$ $M16=M2$

As shown in the exemplary embodiment of FIG. 8, the Branch Metric Computing module includes one L-bit Adder 91, one L-bit Subtracter 92, and a 2'complemeter 93. The Euclidean distances are computed for path M1 and M5. Path M2 is 2'complement of path M1. Path M6 is 2'complement of M5. Path M3 is the same path M2, path M4 is the same as path M1, path M7 is the same as path M6, path M8 is the same as path M5, path M9 is the same as path M6, path M10 is the same as path M5, path M11 is the same as path M5, path M12 is the same as path M6, path M13 is the same as path M2, path M14 is the same as path M1, path M15 is the same as path M1, and path M16 is the same as path M2.

State Metric Computing Module

The State Metric Computing module 72 calculates the probability A(k) of each state transition in forward recursion and the probability B(k) in backward recursion. FIG. 13 shows the implementation of state-metric in forward recursion with Add-Compare-Select (ACS) logic. FIG. 14 shows the implementation of state-metric in backward recursion with Add-Compare-Select (ACS) logic. The calculations are performed at each node in the Turbo Codes Trellis 80 (FIG. 7) in both forward and backward recursion. FIG. 15 shows the forward state transitions in the Turbo Codes Trellis 80 (FIG. 7). FIG. 16 shows the backward state transitions in the Turbo Codes Trellis 80 (FIG. 7). Each node in the Trellis 80 as shown in FIG. 7 has two entering paths: one-path 84 and zero-path 83, from the two nodes in the previous stage.

In an exemplary embodiment, the ACS logic includes an Adder 132, an Adder 134, a Comparator 131, and a Multiplexer 133. In the forward recursion, the Adder 132 computes the sum of the branch metric and state metric in the one-path 84 from the state s(k−1) of previous stage (k−1). The Adder 134 computes the sum of the branch metric and state metric in the zero-path 83 from the state (k−1) of previous stage (k−1). The Comparator 131 compares the two sums and the Multiplexer 133 selects the larger sum for the state s(k) of current stage (k). In the backward recursion, the Adder 142 computes the sum of the branch metric and state metric in the one-path 84 from the state s(j+1) of previous stage (J+1). The Adder 144 computes the sum of the branch metric and state metric in the zero-path 83 from the state s(j+1) of previous stage (J+1). The Comparator 141 compares the two sums and the Multiplexer 143 selects the larger sum for the state s(j) of current stage (j).

The Equations for the ACS are shown below:

$A(k)=\text{MAX}[(bm0+sm0(k-1)),(bm1+sm1(k-1)]$ $B(j)=\text{MAX}[(bm0+sm0(j+1)),(bm1+sm1(j+1)]$ Time (k−1) is the previous stage of (k) in forward recursion as shown in FIG. 15, and time (j+1) is the previous stage of (j) in backward recursion as shown in FIG. 16.

Log-Map Computing Module

The Log-MAP computing module calculates the posteriori probability for u=0 and u=1, for each path entering each state in the Turbo Codes Trellis 80 corresponding to u=0 and u=1 or referred as zero-path 83 and one-path 84. The accumulated probabilities are compared and the u with larger probability is selected. The soft-decisions are made based on the final probability selected for each bit. FIG. 9 shows the implementation for calculating the posteriori probability for u=0. FIG. 10 shows the implementation for calculating the posteriori probability for u=1. FIG. 11 shows the implementation of compare-and-select for the u with larger probability. FIG. 12 shows the implementation of the soft-decode compare logic to produce output bits based on the posteriori probability of u=0 and u=1. The equations for calculating the accumulated probabilities for each state and compare-and-select are shown below:

$\text{sum\_}s00=sm0i+bm1+sm0j$ $\text{sum\_}s01=sm3i+bm7+sm1j$ $\text{sum\_}s02=sm4i+bm9+sm2j$ $\text{sum\_}s03=sm7i+bm15+sm3j$ $\text{sum\_}s04=sm1i+bm4+sm4j$ $\text{sum\_}s05=sm2i+bm6+sm5j$ $$\text{sum\_s06} = sm5i + bm12 + sm6j$$

$$\text{sum\_s07} = sm6i + bm14 + sm7j$$

$$\text{sum\_s10} = sm1i + bm3 + sm0j$$

$$\text{sum\_s11} = sm2i + bm5 + sm1j$$

$$\text{sum\_s12} = sm5i + bm11 + sm2j$$

$$\text{sum\_s13} = sm6i + bm13 + sm3j$$

$$\text{sum\_s14} = sm0i + bm2 + sm4j$$

$$\text{sum\_s15} = sm3i + bm8 + sm5j$$

$$\text{sum\_s16} = sm4i + bm10 + sm6j$$

$$\text{sum\_s17} = sm7i + bm16 + sm7j$$

$$s00\text{sum} = \text{MAX}[\text{sum\_s00}, 0]$$

$$s01\text{sum} = \text{MAX}[\text{sum\_s01}, s00\text{sum}]$$

$$s02\text{sum} = \text{MAX}[\text{sum\_s02}, s01\text{sum}]$$

$$s03\text{sum} = \text{MAX}[\text{sum\_s03}, s02\text{sum}]$$

$$s04\text{sum} = \text{MAX}[\text{sum\_s04}, s03\text{sum}]$$

$$s05\text{sum} = \text{MAX}[\text{sum\_s05}, s04\text{sum}]$$

$$s06\text{sum} = \text{MAX}[\text{sum\_s06}, s05\text{sum}]$$

$$s07\text{sum} = \text{MAX}[\text{sum\_s07}, s06\text{sum}]$$

$$s10\text{sum} = \text{MAX}[\text{sum\_s10}, 0]$$

$$s11\text{sum} = \text{MAX}[\text{sum\_s11}, s10\text{sum}]$$

$$s12\text{sum} = \text{MAX}[\text{sum\_s12}, s11\text{sum}]$$

$$s13\text{sum} = \text{MAX}[\text{sum\_s13}, s12\text{sum}]$$

$$s14\text{sum} = \text{MAX}[\text{sum\_s14}, s13\text{sum}]$$

$$s15\text{sum} = \text{MAX}[\text{sum\_s15}, s14\text{sum}]$$

$$s16\text{sum} = \text{MAX}[\text{sum\_s16}, s15\text{sum}]$$

$$s17\text{sum} = \text{MAX}[\text{sum\_s17}, s16\text{sum}]$$

Control Logics—State Machine (CLSM) Module

As shown in FIG. 6, the Control Logic module controls the overall operations of the Log-MAP Decoder. The control logic state machine 171, referred as CLSM, is shown in FIG. 17. The CLSM module 171 (FIG. 17) operates effectively as follows. Initially, the CLSM module 171 operates in IDLE state 172. When the decoder is enabled, the CLSM module 171 transitions to CALC-BM state 173, where the Branch Metric (BM) module starts operations and monitors for completion. When Branch Metric calculations are completed, referred to as bm-done, the CLSM transitions to CALC-FWD-SM state 174, where the State Metric module (SM) begins forward recursion operations. When the forward SM state metric calculations are completed, referred to as fwd-sm-done, the CLSM transitions to CALC-BWD-SM state 175, where the State Metric module (SM) begins backward recursion operations. When backward SM state metric calculations are completed, referred to as bwd-sm-done, the CLSM transitions to CALC-Log-MAP state 176, where the Log-MAP computation module begins calculating the maximum a posteriori (MAP) probability to produce soft decode output. When Log-MAP calculations are completed, referred to as log-map-done, the CLSM module 171 transitions back to IDLE state 172.

BM Memory and SM Memory

The Branch-Metric Memory 74 and the State-Metric Memory 75 are shown in FIG. 6 as the data storage components for BM module 71 and SM module 72. The Branch Metric Memory module is a dual-port RAM that contains M-bits of N memory locations as shown in FIG. 18. The State Metric Memory module is a dual-port RAM that contains K-bits of N memory locations as shown in FIG. 19. Data can be written into one port while reading at the other port.

Interleaver Memory

As shown in FIG. 3, the Interleaver Memory A 43 stores data for the first decoder A 42 and Interleaver Memory B 45 stores data for the second decoder B 44. In iterative pipelined decoding, the decoder A 42 reads data from Interleaver Memory B 45 and writes results data into Interleaver Memory B 43, the decoder B 44 reads data from Interleaver Memory A 43 and write results into Interleaver Memory B 45.

As shown in FIG. 20, the De-Interleaver memory 41 includes a De-Interleaver module 201 and a dual-port RAM 202, which contains M-bits of N memory locations. The Interleaver is a Turbo code internal interleaver as defined by 3GPP standard ETSI TS 125 222 V3.2.1 (2000-05), or other source. The Interleaver permutes the address input port A for all write operations into dual-port RAM module. Reading data from output port B are done with normal address input.

The Interleaver Memory module uses an interleaver to generate the write-address sequences of the Memory core in write-mode. In read-mode, the memory core read-address is normal sequences.

As shown in FIG. 21, the Input Buffer Memory 43 45 comprises of a dual-port RAM 211, which contains M-bits of N memory locations.

Turbo Codes Decoder Control Logics—State Machine (TD-CLSM

As shown in FIG. 3, the Turbo Decoder Control Logics module 47, referred to as TDCLSM, controls the overall operations of the Turbo Codes Decoder. Log-MAP A 42 starts the operations of data in Memory B 45. At the same time, Log-MAP B starts the operations in Memory A 43. When Log-MAP A 42 and Log-MAP B 44 finish with block N of data, the TDCLSM 47 starts the iterative decoding for L number of times. When the iterative decoding sequences are completed, the TDCLSM 47 transitions to HARD-DEC to generate the hard-decode outputs. Then the TDCLSM 47 transitions to start decoding another block of data.

Iterative Decoding and Diversity Processing

Turbo Codes decoder performs iterative decoding and diversity processing by feeding back the output Z1, Z3 of the second Log-MAP decoder B into the corresponding first Log-MAP decoder A before making decision for hard-decoding output. As shown in FIG. 23, the Counter 233 counts the preset number L times.

Diversity Logic

As shown in FIG. 3, the Diversified Logic module 48 computes the feedback intrinsic values Z5 into the decoders 40a and 40b inputs through Adder 231. In accordance with the method of the invention, the Diversified Logics module 48 performs the following calculations to produce the intrinsic value Z5.

Computes the soft-decision error value: $x = Z1 - Z3$

Computes the "Running-Average Filter" over windows N of all error values to produce current average error value y(i) as shown in equation below:

$$y(i) = \frac{1}{N}\sum_{j=0}^{N-1} x(i-j)$$

Finally, produces the intrinsic feedback value: $Z5=y(i)$

As shown in FIG. 3, the Diversified Logic module 48 also computes the sum Z1+Z3 for output to the Hard-Decoder block.

The invention claimed is:

1. A diversity baseband processing system for iteratively decoding received multipath signals arriving at multiple antennas of a Multiple Input/Multiple Output (MIMO) system, the baseband processing system comprising:
at least two soft decision decoders adapted to receive soft data associated with corresponding signal paths, wherein the at least two soft decision decoders are serially coupled and have at least a first soft decision decoder and a last soft decision decoder, wherein the last soft decision decoder is adapted to output soft data for the serially coupled series of soft decision decoders in iterative mode, and wherein each soft decision decoder further comprises:
a branch metric module adapted to receive soft input signal and configured to compute branch metric values for each branch in a Trellis by calculating a Euclidean distance for each branch;
a branch metric memory module coupled to the branch metric module and adapted to store data associated at least with the branch metric values;
a state metric module coupled to the branch metric memory module and configured to compute state metric values for each state in the Trellis using the computed branch metric values;
a state metric memory module coupled to the state metric module and adapted to store data associated at least with the state metric values;
a log-likelihood ratio (LLR) computation module coupled to at least the branch metric memory module and the state metric memory module, and configured to compute a soft decision output based at least on the branch metric values and the state metric values;
a control logic state machine module adapted to utilize sliding windows on at least one of the branch metric module, the branch metric memory module, the state metric module, the add-compare-select circuit, the state metric memory module, and the computation module; and
an add-compare-select circuit coupled to the state metric module and configured to compute state metric values at each node in the Trellis, wherein the add-compare-select circuit further comprises:
a first adder for computing the sum of a first state metric value and a first branch metric value;
a second adder for computing the sum of a second state metric value and a second branch metric value;
a comparator for comparing the results of the first adder and the results of the second adder; and
a multiplexer for selecting a larger sum for a predetermined state;
at least one memory module electrically coupled to an output of a corresponding soft decision decoder, wherein the output of the memory module associated with the last soft decision decoder is fed back as an input to the first soft decision decoder of each of the at least two decoders, and wherein at least one memory module comprises an interleaver memory having an interleaver that generates a write address sequence for a memory core in a write mode; and
at least a hard decoder arranged to perform hard decoded output for the baseband processing system.

2. The system according to claim 1, further comprising:
a smooth function that performs running average calculations of soft decision values.

3. The system according to claim 1, wherein the state metric module computes state metric values based on forward recursion.

4. The system according to claim 1, wherein the state metric module computes state metric values based on backward recursion.

5. The system according to claim 1, wherein the soft decision decoder uses a logarithm maximum a posteriori probability algorithm.

6. The system according to claim 1, wherein the soft decision decoder uses a Soft-input Soft-output method maximum a posteriori probability algorithm.

7. The system according to claim 1, wherein the state metric module computes state metric values based on forward recursion and backward recursion for each data element of the soft decision data associated with the predetermined block size.

8. The system according to claim 1, wherein the soft decision decoder uses a logarithm approximation algorithm.

9. The system according to claim 1, wherein the at least one memory module comprises a dual-port random access memory.

10. The system according to claim 1, wherein the MIMO system is a diversity processing system computing multipath signals from multiple diversity antennas.

11. A method of diversity processing multipath signals arriving at multiple antennas received on multiple data paths using at least two soft decision decoders adapted to receive signals associated with corresponding data paths, wherein the at least two soft decision decoders are serially coupled and have at least a first soft decision decoder and a last soft decision decoder, wherein the last soft decision decoder is adapted to output data for the serially coupled series of soft decision decoders, the method comprising:
receiving first soft decision data at a first decoder;
receiving second soft decision data at a second decoder;
utilizing a sliding window having a predetermined block size to process data received at the first decoder and data received at the second decoder;
providing the corresponding data processed by the sliding window at the first decoder to the associated at least two serially coupled soft decision decoders;
providing the corresponding data processed by the sliding window at the second decoder to the associated at least two serially coupled soft decision decoders; and
performing, for a predetermined number of times, iterative decoding at the first and second decoders,
wherein an output from the last soft decision decoder is fed back as an input to the first soft decision decoder of each of the first and second decoders.

12. The method according to claim 11, further comprising controlling an operation of the first and second decoders when data is received at corresponding ones of the multiple data paths.

13. The method according to claim 11, further comprising:
adding an output from each of the first and second decoders; and
providing hard decoded output data from the added data after performing the iterative decoding for the predetermined number of times.

14. The method according to claim 11, wherein the at least two serially coupled soft decision decoders associated with the first and second decoders perform processing using a logarithm maximum a posteriori probability algorithm.

15. The method according to claim 11, wherein the at least two serially coupled soft decision decoders associated with the first and second decoders perform processing using a Soft-input Soft-output method logarithm maximum a posteriori probability algorithm.

16. The method according to claim 11, wherein the at least two serially coupled soft decision decoders associated with the first and second decoders perform processing using a logarithm approximation algorithm.

17. The method according to claim 11, wherein utilizing the sliding window having the predetermined block size enables the data to be processed in a pipeline scheme.

18. The method according to claim 11, wherein the output of the last soft decision decoder is fed back to the first soft decision decoder for each of the first and second decoders in a pipeline mode to produce soft decoded data at each clock cycle.

19. A soft decision decoder comprising:
a branch metric module that is adapted to receive soft input signal and is configured to compute branch metric values for each branch in a Trellis by calculating a Euclidean distance for each branch;
a branch metric memory module that is coupled to the branch metric module and is adapted to store data associated at least with the branch metric values;
a state metric module that is coupled to the branch metric memory module and is configured to compute state metric values for each state in the Trellis using the computed branch metric values;
an add-compare-select circuit that is coupled to the state metric module and is configured to compute state metric values at each node in the Trellis;
a state metric memory module that is coupled to the state metric module and is adapted to store data associated at least with the state metric values;
a computation module that is coupled to at least the branch metric memory module and the state metric memory module, wherein the computation module is configured to compute a soft decision output based at least on the branch metric values and the state metric values; and
a control logic state machine module that is adapted to control operations of at least one of the branch metric module, the branch metric memory module, the state metric module, the add-compare-select circuit, the state metric memory module, and the computation module.

20. The soft decision decoder according to claim 19, wherein the computation module is implemented with a logarithm approximation algorithm.

21. The soft decision decoder according to claim 19, wherein the add-compare-select circuit comprises:
a first adder for computing the sum of a first state metric value and a first branch metric value;
a second adder for computing the sum of a second state metric value and a second branch metric value;
a comparator for comparing the results of the first adder and the results of the second adder; and
a multiplexer for selecting a larger sum for a predetermined state.

22. A soft decision decoder comprising:
branch metric means for receiving soft input signal and computing branch metric values for each branch in a Trellis by calculating a Euclidean distance for each branch;
branch metric memory means for storing data associated at least with the branch metric values;
state metric means for computing state metric values for each state in the Trellis using the computed branch metric values;
add-compare-select means for computing state metric values at each node in the Trellis;
state metric memory means for storing data associated at least with the state metric values;
computation means for computing a soft decision output based at least on the branch metric values and the state metric values; and
control logic state machine means for controlling operations of at least one of the branch metric means, the branch metric memory means, the state metric means, the add-compare-select means, the state metric memory means, and the computation means.

23. A method of implementing a soft decision decoder for decoding a plurality of baseband signals, comprising:
receiving soft decision data;
utilizing a sliding window of a predetermined block size to process the soft decision data;
computing a branch metric for each data element of the soft decision data associated with the predetermined block size, wherein the branch metric is computed for branches entering each state in the Trellis;
computing a forward recursion state metric for each data element of the soft decision data associated with the predetermined block size, wherein the state metric is computed for each state in the Trellis;
computing a backward recursion state metric for each data element of the soft decision data associated with the predetermined block size, wherein the state metric is computed for each state in the Trellis;
computing logarithm maximum a posteriori probability values based on at least the branch metric, the forward recursion state metric, and the backward recursion state metric for each data element of the soft decision data associated with the predetermined block size; and
providing soft-decisions based on the logarithm maximum a posteriori probability values,
wherein computing the branch metric for each data element comprises calculating a Euclidean distance for each branch.

24. The method according claim 11, wherein performing, for a predetermined number of times, iterative decoding at the first and second decoders comprises:
processing the data received on the multiple data paths using an algorithm comprised of a log-MAP algorithm or a logarithm approximation algorithm to generate a soft decision;
storing the soft decision;
performing iterative decoding from the first soft decision decoder to the last soft decision decoder in circular circuit for the predetermined number of times; and
determining a hard decision output.

25. A method of processing according claim 1, wherein the data is received on the multiple data paths from a plurality of antennas, wherein performing, for a predetermined number of times, iterative decoding at the first and second decoders comprises:

processing the data received on the multiple data paths using an algorithm comprised of a log-MAP algorithm or a logarithm approximation algorithm to generate a soft decision;

storing the soft decision;

performing iterative decoding from the first soft decision decoder to the last soft decision decoder in circular circuit for the predetermined number of times; and determining a hard decision output.

26. The method according to claim 11, wherein the data is received on the multiple data paths from a plurality of antennas, wherein utilizing a sliding window having a predetermined block size to process data received at the first decoder comprises utilizing a sliding window having a predetermined block size for pipelined processing of soft decision data from the first soft decision decoder to the second soft decision decoder iteratively.

* * * * *